United States Patent
Sato et al.

(10) Patent No.: US 8,903,667 B2
(45) Date of Patent: Dec. 2, 2014

(54) STATE-OF-CHARGE ESTIMATION METHOD, STATE-OF-CHARGE ESTIMATION DEVICE, AND SECONDARY-BATTERY POWER SYSTEM

(75) Inventors: Etsuzo Sato, Tokyo (JP); Noriyasu Iwane, Tokyo (JP)

(73) Assignees: Furukawa Electric Co., Ltd., Tokyo (JP); Furukawa Automotive Systems Inc., Inukami-gun (JP)

(*) Notice: Subject to any disclaimer, the term of this patent is extended or adjusted under 35 U.S.C. 154(b) by 89 days.

(21) Appl. No.: 13/616,792

(22) Filed: Sep. 14, 2012

(65) Prior Publication Data

US 2013/0013237 A1 Jan. 10, 2013

Related U.S. Application Data

(63) Continuation of application No. PCT/JP2011/053683, filed on Feb. 21, 2011.

(30) Foreign Application Priority Data

Mar. 30, 2010 (JP) ................................. 2010-079617

(51) Int. Cl.
G01R 31/36 (2006.01)
(52) U.S. Cl.
CPC .................................. *G01R 31/362* (2013.01)
USPC .......................................................... 702/63
(58) Field of Classification Search
CPC .................................................. G01R 31/362
USPC .......................................................... 702/63
See application file for complete search history.

(56) References Cited

U.S. PATENT DOCUMENTS

| 7,098,625 B2 | 8/2006 | Yumoto et al. |
| 7,525,284 B2 | 4/2009 | Iwane et al. |
| 7,764,049 B2 | 7/2010 | Iwane et al. |

(Continued)

FOREIGN PATENT DOCUMENTS

| CN | 1503399 A | 6/2004 |
| CN | 101275991 A | 10/2008 |

(Continued)

OTHER PUBLICATIONS

International Search Report issued May 24, 2011 in PCT/JP2011/053683 filed Feb. 21, 2011 (in English).

(Continued)

*Primary Examiner* — Bryan Bui
(74) *Attorney, Agent, or Firm* — Oblon, Spivak, McClelland, Maier & Neustadt, L.L.P.

(57) ABSTRACT

There is provided a state-of-charge estimation method, a state-of-charge estimation device, and a secondary-battery power system that may quickly and stably determine the convergence value of an adjustment parameter of a voltage characteristic formula that may approximate change over time of an open-circuit voltage of a secondary battery with high precision by appropriately setting the initial value of the adjustment parameter. At step S14, a selected voltage measurement values V1, VMbi ((i=1 to (n−1)), and $VM_m$ are used to calculate an initial value $A0_i$ (i=1 to n) of an adjustment parameter $A_i$ (i=1 to n). In addition, at step S15, an integer string bi (i=1 to (n−1)) and a real number C are used to calculate an initial value $B0_i$ (i=1 to n) of an adjustment parameter $B_i$ (i=1 to n).

11 Claims, 7 Drawing Sheets

(56) References Cited

U.S. PATENT DOCUMENTS

| | | | |
|---|---|---|---|
| 7,899,631 B2 | 3/2011 | Iwane | |
| 8,108,161 B2 * | 1/2012 | Tomura et al. | 702/63 |
| 8,615,372 B2 * | 12/2013 | Tomura et al. | 702/63 |
| 2002/0113594 A1 | 8/2002 | Satake | |
| 2004/0100227 A1 | 5/2004 | Yumoto et al. | |
| 2006/0208704 A1 | 9/2006 | Iwane et al. | |
| 2007/0029973 A1 * | 2/2007 | Ashizawa et al. | 320/132 |
| 2008/0243405 A1 | 10/2008 | Iwane | |
| 2009/0027007 A1 | 1/2009 | Iwane et al. | |

FOREIGN PATENT DOCUMENTS

| | | |
|---|---|---|
| JP | 07-098367 A | 4/1995 |
| JP | 2002-234408 A | 8/2002 |
| JP | 2003-075518 A | 3/2003 |
| JP | 2005-43339 A | 2/2005 |
| JP | 2008-096328 A | 4/2008 |
| JP | 2010-002227 A | 1/2010 |

OTHER PUBLICATIONS

Office Action issued Jun. 10, 2013 in Japanese Application No. 2010-079617 (With English Translation).

Combined Chinese Office Action and Search Report issued Feb. 24, 2014 in Patent Application No. 201180014445.X (with English language translation of the Office Action and English translation of categories of cited documents).

* cited by examiner

TIME AFTER COMPLETION OF CHARGE/DISCHARGE [SECOND]

TIME AFTER COMPLETION OF CHARGE/DISCHARGE [SECOND]

US 8,903,667 B2

STATE-OF-CHARGE ESTIMATION METHOD, STATE-OF-CHARGE ESTIMATION DEVICE, AND SECONDARY-BATTERY POWER SYSTEM

CROSS-REFERENCE TO RELATED APPLICATIONS

This application is a continuation of PCT International Application Serial No. PCT/JP2011/053683, filed on Feb. 21, 2011, which claims the benefit of priority to Japanese Patent Application No. 2010-079617, filed on Mar. 30, 2010, the entire contents of both of which are incorporated herein by reference.

TECHNICAL FIELD

The present invention relates to the technical field of a state-of-charge estimation method and a state-of-charge estimation device for estimating the state of charge of a secondary battery to supply electric power to load.

BACKGROUND ART

Conventionally, the current state of charge of a secondary battery, such as a lead acid storage battery mounted on a car etc. is required to be accurately known. In a secondary battery, in general, since correlation exists between the state of charge and the open-circuit voltage (OCV) in a stable condition, the state of charge may be estimated by calculating the open-circuit voltage. However, the open-circuit voltage of the secondary battery must be measured when charging or discharging is not being performed, and it takes a long time for the open-circuit voltage to be stabilized after charging or discharging is finished. Therefore, various methods for calculating convergence value of the open-circuit voltage have been proposed using the function (voltage characteristic formula) for approximating the time characteristics of the open-circuit voltage (for example, Patent Documents 1 to 3).

In each of the above-described conventional method, the voltage characteristic formula of the open-circuit voltage has an adjustment parameter, and this adjustment parameter is determined by using the measured value of the open-circuit voltage obtained by measuring for a short period of time. And the convergence value of the open-circuit voltage is calculated using the voltage characteristic formula applied with the determined adjustment parameter.

When the convergence value of the open-circuit voltage of the secondary battery is calculated with the above-described conventional method, its precision depends on the precision of the voltage characteristic formula. In general, a polynomial function, a logarithmic function, etc. are used as a voltage characteristic formula; however, since approximating the time characteristics of the open-circuit voltage of the secondary battery with high precision using these functions is difficult, the error of the convergence value of the open-circuit voltage is large.

On the other hand, in the Patent Document 4, a quartic or more exponential attenuation function is used for approximate calculation of the open-circuit voltage of the secondary battery to be able to approximate the open-circuit voltage with high precision and to estimate the state of charge with high precision. In case a complicated nonlinear function such as a quartic or more exponential attenuation function is used for approximate calculation of the open-circuit voltage of the secondary battery, when the adjustment parameter is optimized using a voltage measurement value, the optimum solution of the least-square method must be obtained by solving sequential calculation such as the Gauss-Newton method or the Levenberg-Marquardt method or by performing filtering calculation such as Kalman filter calculation.

Any method described above for optimizing the adjustment parameter has a problem of requiring to set the initial value of the adjustment parameter, and depending on the initial value, the calculation may diverge and the convergence value of the adjustment parameter may not be obtained, or it take extremely long time even when it may be obtained. The Patent Document 4 proposes a method for quickly and stably determining the convergence value of an adjustment parameter.

PRIOR ART DOCUMENT

Patent Document

Patent Document 1: Japanese Patent Application Laid-open No. H7-98367
Patent Document 2: Japanese Patent Application Laid-open No. 2002-234408
Patent Document 3: Japanese Patent Application Laid-open No. 2003-75518
Patent Document 4: Japanese Patent Application Laid-open No. 2008-96328

SUMMARY OF THE INVENTION

Problem to be Solved by the Invention

However, the above-described conventional methods for estimating the state-of-charge of the secondary battery have the following problems. With the method of the Patent Document 4, the initial value of the adjustment parameter is uniquely determined by using only the initial voltage measurement value during the data acquisition period and the voltage measurement value immediately before completion. Therefore, an unsuitable value may be set as an initial value, in which case the optimal calculation of the adjustment parameter may not converge. That is to say, when change of the open-circuit voltage after charge/discharge of the secondary battery finishes is within the range of the voltage profile (gradually lowering or rising) assumed in advance, the optimization of the adjustment parameter is possible; however, since there are various charge/discharge histories in real vehicles, the voltage profile may be outside the assumed range. As an example, as shown in FIG. 9, the change of the voltage measurement value is reversed in the middle of a voltage measurement period. With the method of the Patent Document 4, since the initial value of the adjustment parameter is determined from the initial voltage measurement value during the data acquisition period and the voltage measurement value immediately before completion even with such a voltage profile, the optimization of the adjustment parameter sometimes did not converge.

The present invention is devised to solve these problems, and has an object to provide a state-of-charge estimation method, a state-of-charge estimation device, and a secondary-battery power system that may quickly and stably determine the convergence value of the adjustment parameter of the voltage characteristic formula that may approximate change over time of the open-circuit voltage of the secondary battery with high precision by appropriately setting the initial value of the adjustment parameter and estimate the state of charge.

Means for Solving the Problem

The first aspect of the state-of-charge estimation method according to the present invention is a state-of-charge estimation method, wherein change over time of an open-circuit voltage (OCV) of a secondary battery after completion of charge/discharge is approximated with a voltage characteristic formula having an adjustment parameter, and the open-circuit voltage in a stable condition of the secondary battery is calculated from the voltage characteristic formula to estimate the state of charge of the secondary battery, and wherein the method obtains m (m is a natural number) measured values (hereinafter referred to as a voltage measurement value) of the open-circuit voltage of the secondary battery in a given cycle during a given data acquisition period after completion of charge/discharge of the secondary battery, selects the voltage measurement value at given selection timing from the m voltage measurement values to use as a selected voltage measurement value, calculates the initial value of the adjustment parameter based on the selected voltage measurement value and the selection timing, calculates the convergence value by gradually correcting the adjustment parameter from the initial value so that the error between the open-circuit voltage calculated with the voltage characteristic formula and the m voltage measurement values is the smallest, calculates the open-circuit voltage in the stable condition by using the convergence value of the adjustment parameter for the voltage characteristic formula, and estimates the state of charge of the secondary battery from the open-circuit voltage in the stable condition.

In another aspect of the state-of-charge estimation method according to the present invention, when the adjustment parameter is $\{A_i\}$ (i=1 to n), $\{B_i\}$ (i=1 to n), and Vc, the n is an integer equal to or greater than four, and the t is the elapsed time after completion of charge/discharge, the voltage characteristic formula is given as:

$$V(t)=A_1\times\exp(B_1\times t))+A_2\times\exp(B_2\times t)+\ldots+A_n\times\exp(B_n\times t)+Vc$$

when $\{b_i\}$ (i=1 to (n−1)) is an integer string that satisfies $1<b_1<b_2<\ldots<b_{n-1}$ and is set in advance to correspond to the selection timing, the initial values $\{A0_i\}$ (i=1 to n), $\{B0_i\}$ (i=1 to n), and V0c of the adjustment parameters $\{A_i\}$ (i=1 to n), $\{B_i\}$ (i=1 to n), and Vc, respectively, are calculated using the selected voltage measurement value at the selection timing determined from the integer string $\{b_i\}$ (i=1 to (n−1)).

In another aspect of the state-of-charge estimation method according to the present invention, the integer string $\{b_i\}$ (i=1 to (n−1)) satisfies $(b_1-1)<(b_2-b_1)<\ldots<(b_{n-1}-b_{n-2})<(m-b_{n-1})$.

In another aspect of the state-of-charge estimation method according to the present invention, when the voltage measurement value is $\{VM_j\}$ (j=1 to m), the cycle to obtain the voltage measurement value is $\Delta t$, and the C is a real number set in advance, the voltage measurement value $VM_1$ obtained at the beginning of the data acquisition period, a voltage measurement value $\{VM_k\}$ (k=$b_i$; i=1 to (n−1)) with the integer string $\{b_i\}$ (i=1 to (n−1)) as the selection timing, and the selected voltage measurement value $VM_m$ obtained at the end of the data acquisition period are selected as the selected voltage measurement values, and the initial value $\{A0_i\}$ (i=1 to n), $\{B0_i\}$ (i=1 to n), and V0c are calculated with:

$A0_1=VM_1-VM_k(k=b_1)$ $A0_i=VM_{kk}-VM_k(kk=b_{i-1}, k=b_i; i=2$ to $(n-1))$ $A0_n=VM_k-VM_m(k=b_{n-1})$ $B0_i=-1/((b_i-1)\times\Delta t\times C)$ (i=1 to (n−1))

$B0_n=-1/((m-1)\times\Delta t\times C)$ $V0c=VM_m$

In another aspect of the state-of-charge estimation method according to the present invention, when the voltage measurement value $\{VM_j\}$ (j=1 to m) has a peak value $VM_{jp}$ that becomes the greatest or the smallest during the data acquisition period, the selection timing $b_i$ nearest to the timing jp of the peak value is determined from the integer string $\{b_i\}$ (i=1 to (n−1)), and the selection timing $b_i$ is replaced by the timing jp of the peak value to remake the integer string $\{b_i\}$ (i=1 to (n−1)), and the initial value $\{A0_i\}$ (i=1 to n) and $\{B0_i\}$ (i=1 to n) are calculated using the changed integer string $\{b_i\}$ (i=1 to (n−1)).

In another aspect of the state-of-charge estimation method according to the present invention, when the voltage measurement value is $\{VM_j\}$ (j=1 to m), the cycle to obtain the voltage measurement value is $\Delta t$, the C is a real number set in advance, and the voltage measurement value $\{VM_j\}$ (j=1 to m) has a peak value $VM_{jp}$ (j=jp) that becomes the greatest or the smallest during the data acquisition period, as the selected voltage measurement value, the voltage measurement value $VM_{jp}$ of the peak value, the voltage measurement value $\{VM_k\}$ (k=$bb_i$; i=1 to (n−1)) that uses, as the selection timing, the integer string $\{bb_i\}=\{b_i+jp-1\}$ (i=1 to (n−1)) with the integer string $\{b_i\}$ (i=1 to (n−1)) changed only by (jp−1), and the selected voltage measurement value $VM_m$ obtained at the end of the data acquisition period are selected, wherein the initial value $\{A0_i\}$ (i=1 to n), $\{B0_i\}$ (i=1 to n), and V0c are calculated with:

$A0_1=VM_{jp}-VM_k(k=bb_1)$ $A0_i=VM_{kk}-VM_k(kk=bb_{i-1}, k=bb_i; i=2$ to $(n-1))$ $A0_n=VM_k-VM_m(k=bb_{n-1})$ $B0_i=-1/((bb_i-1)\times\Delta t\times C)$ (i=1 to (n−1))

$B0_n=-1/((m-1)\times\Delta t\times C)$ $V0c=VM_m$

In another aspect of the state-of-charge estimation method according to the present invention, when the voltage measurement value is $\{VM_j\}$ (j=1 to m), the cycle to obtain the voltage measurement value is $\Delta t$, the C is a real number set in advance, and the voltage measurement value $\{VM_j\}$ (j=1 to m) has a peak value $VM_{jp}$ (j=jp) that becomes the greatest or the smallest during the data acquisition period, as the selected voltage measurement value, the voltage measurement value $VM_{jp}$ of the peak value, the voltage measurement value $\{VM_k\}$ (k=$bc_i$; i=1 to (n−1)) that uses, as the selection timing, the integer string $\{bc_i\}=$ {integer part of $[(b_i-1)\times(m-jp)/(m-1)+jp]\}$ (i=1 to (n−1)) that moved the integer string $\{b_i\}$ (i=1 to (n−1)) between the jp and the m to keep the interval ratio of the integer string as much as possible, and the selected voltage measurement value $VM_m$ obtained at the end of the data acquisition period are selected, wherein the initial value $\{A0_i\}$ (i=1 to n), $\{B0_i\}$ (i=1 to n), and V0c are calculated with:

$A0_1=VM_{jp}-VM_k(k=bc_1)$ $A0_i=VM_{kk}-VM_k(kk=bc_{i-1}, k=bc_i; i=2$ to $(n-1))$ $A0_n=VM_k-VM_m(k=bc_{n-1})$ $B0_i=-1/((bc_i-1)\times\Delta t\times C)$ (i=1 to (n−1))

$B0_n=-1/((m-1)\times\Delta t\times C)$ $V0c=VM_m$

In another aspect of the state-of-charge estimation method according to the present invention, the open-circuit voltage when the secondary battery is in a stable condition is calculated by substituting a given time defined in advance to the voltage characteristic formula using the convergence value for the adjustment parameter.

The first aspect of the state-of-charge estimation device according to the present invention provides a state-of-charge estimation device for estimating a state of charge of a secondary battery, including: a voltage sensor for measuring a voltage of the secondary battery; a control part for performing and controlling calculation for estimating the state of charge using a voltage characteristic formula having an adjustment parameter; a storage part for storing a voltage measurement value measured with the voltage sensor and data used for the calculation with the control part, wherein the control part obtains m (m is a natural number) measured values (hereinafter referred to as a voltage measurement value) of the open-circuit voltage of the secondary battery in a given cycle during a given data acquisition period after completion of charge/discharge of the secondary battery, selects a voltage measurement value at given selection timing from the m voltage measurement values to use as a selected voltage measurement value, calculates the initial value of the adjustment parameter based on the selected voltage measurement value and the selection timing, calculates the convergence value by gradually correcting the adjustment parameter from the initial value so that the error between the open-circuit voltage calculated with the voltage characteristic formula and the m voltage measurement values is the smallest, and calculates the open-circuit voltage in the stable condition by using the convergence value of the adjustment parameter for the voltage characteristic formula, and estimates the state of charge of the secondary battery from the open-circuit voltage in the stable condition.

In another aspect of the state-of-charge estimation device according to the present invention, when the adjustment parameters are $\{A_i\}$ (i=1 to n), $\{B_i\}$ (i=1 to n), and Vc, the n is an integer equal to or greater than four, and the t is an elapsed time after completion of charge/discharge, the control part uses the following formula as the voltage characteristic formula:

$$V(t)=A_1 \times \exp(B_1 \times t)) + A_2 \times \exp(B_2 \times t) + \ldots + A_n \times \exp(B_n \times t) + Vc$$

and when $\{b_i\}$ (i=1 to (n−1)) is an integer string that satisfies $1 < b_1 < b_2 < \ldots < b_{n-1}$ and that is set in advance to correspond to the selection timing, the initial values $\{A0_i\}$ (i=1 to n), $\{B0_i\}$ (i=1 to n), and $V0c$ of the adjustment parameters $\{A_i\}$ (i=1 to n), $\{B_i\}$ (i=1 to n), and Vc, respectively, are calculated using the selected voltage measurement value at the selection timing determined from the integer string $\{b_i\}$ (i=1 to (n−1)).

The first aspect of the secondary-battery power system according to the present invention includes a secondary battery; a charging circuit for charging the secondary battery; and the state-of-charge estimation device according to claim 9 or 10 for estimating the state of charge of the secondary battery.

Effect of the Invention

According to the present invention, there is provided a state-of-charge estimation method, a state-of-charge estimation device, and a secondary-battery power system that may quickly and stably determine the convergence value of the adjustment parameter of the voltage characteristic formula that may approximate change over time of the open-circuit voltage of the secondary battery with high precision by appropriately setting the initial value of the adjustment parameter and estimate the state of charge.

DESCRIPTION OF EMBODIMENTS

Figure 1:
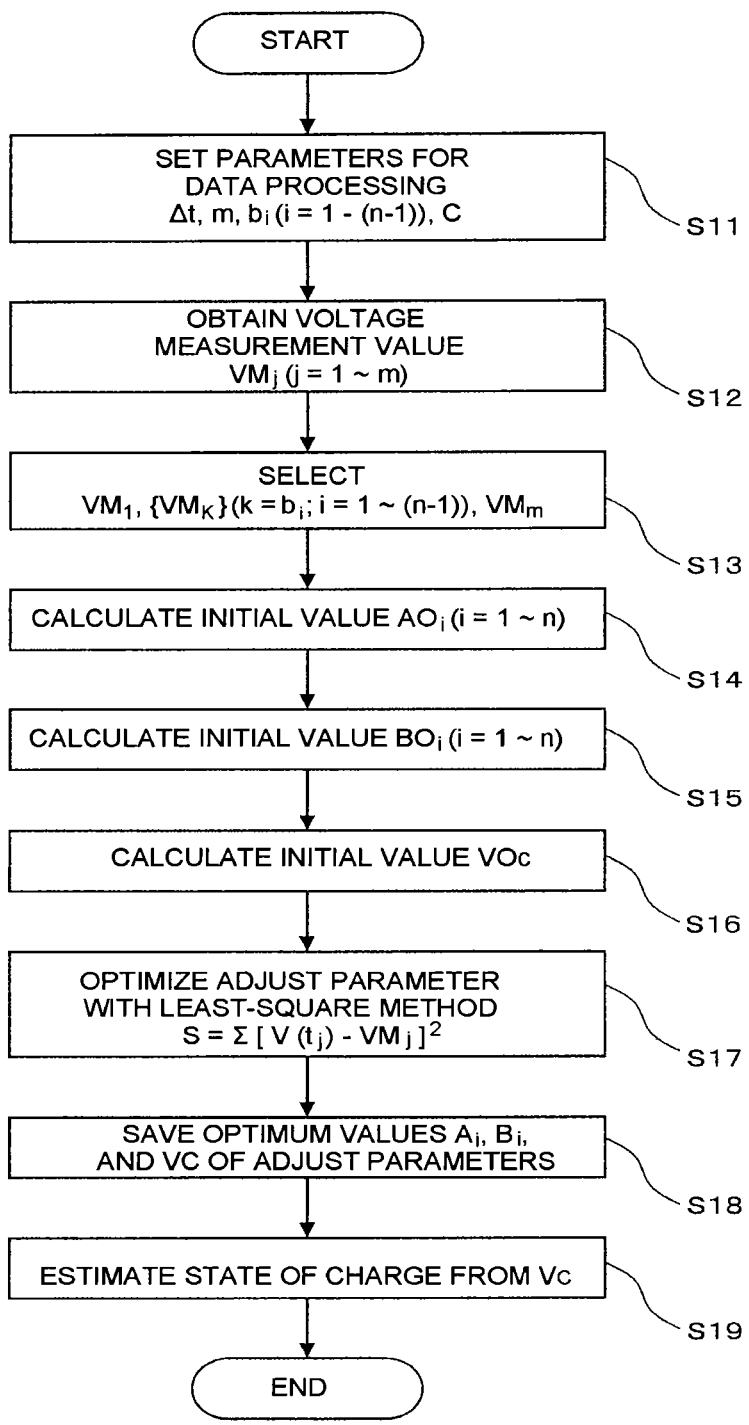
FIG. 1 is a flow chart illustrating a state-of-charge estimation method according to a first embodiment of the present invention.

A state-of-charge estimation method, a state-of-charge estimation device, and the structure of a secondary-battery power system according to preferred embodiments of the present invention are illustrated in detail with reference to the drawings. Components with the same function are indicated by the same reference numerals for the purpose of simplifying the drawings and description. Hereinafter, the present invention is applied to a secondary battery mounted on a vehicle, such as a car, for explanation, but is not limited thereto.

Figure 2:
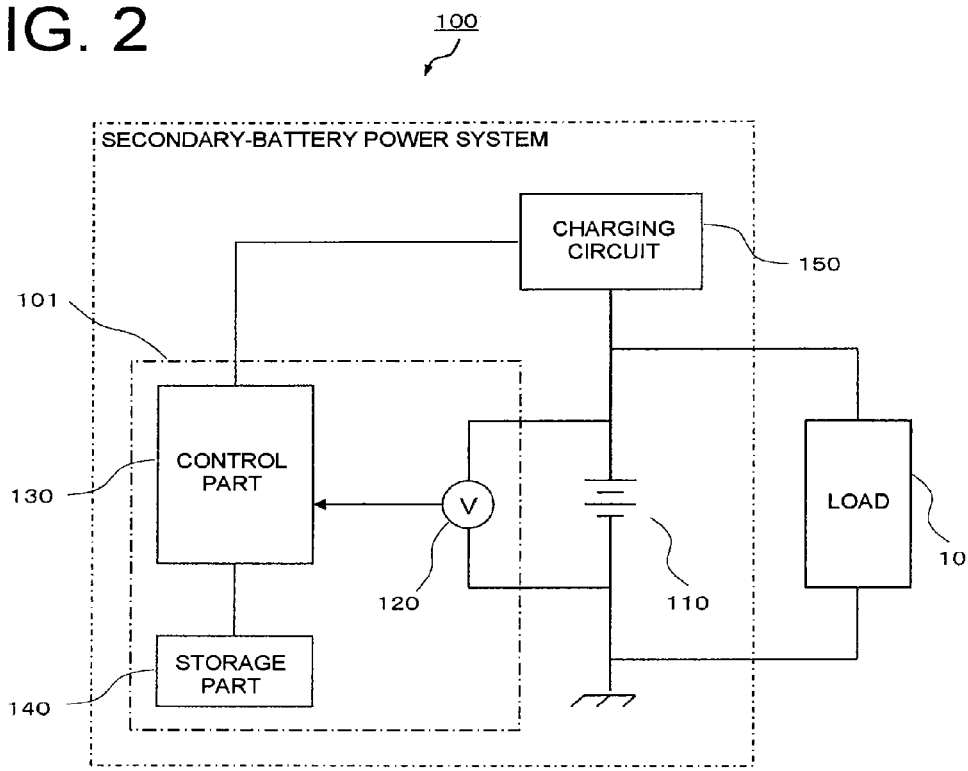
FIG. 2 is a block diagram showing the outline structure of a state-of-charge estimation device and a secondary-battery power system according to one embodiment of the present invention.

The state-of-charge estimation device and secondary-battery power system according to an embodiment of the present invention are described using FIG. 2. FIG. 2 is a block diagram showing the outline structure of a state-of-charge estimation device 101 and a secondary-battery power system 100 according to this embodiment. The secondary-battery power system 100 may be configured with a secondary battery 110 and the state-of-charge estimation device 101 for estimating the state of charge of the secondary battery 110.

The state-of-charge estimation device 101 includes a voltage sensor 120 for measuring the voltage of the secondary battery 110; a control part 130 for inputting a voltage measurement value from the voltage sensor 120 and estimating the state of charge of the secondary battery 110; and a storage part 140 for storing data etc. that are used for calculation performed by the control part 130. The voltage sensor 120 is used for measuring the open-circuit voltage of the secondary battery 110 in a given cycle after completion of charge/discharge. The control part 130 obtains the open-circuit voltage from the voltage sensor 120 in a given cycle and saves it in the storage part 140 during the data acquisition period after completion of charge/discharge.

The secondary-battery power system 100 may be configured so that the control part 130 also controls charge of the secondary battery 110 based on the state of charge estimated by the control part 130. FIG. 2 shows an example in which the secondary-battery power system 100 is also provided with a charging circuit 150, and controls the charging circuit 150 based on the state of charge estimated by the control part 130 to charge the secondary battery 110.

The secondary-battery power system 100 configured as described above is connected with a load 10, such as a motor, and electric power is supplied to the load 10 from the secondary battery 110. In a case of a vehicle, such as a car, a lead acid storage battery is used as the secondary battery 110, for example.

The control part 130 configured with a CPU etc. for performing data processing performs data processing for estimating the state of charge as described below at given timing. The storage part 140 connected to the control part 130 includes a ROM for storing various programs, such as a control program, in advance, and a RAM for storing various data used for processing the control part 130, etc.

Next, the state-of-charge estimation method according to the first embodiment of the present invention is described below. The state-of-charge estimation method according to this embodiment is used for estimating the state of charge of the secondary battery 110 in the control part 130 of the state-of-charge estimation device 101. In general, the state of charge of the secondary battery has a strong correlation with the open-circuit voltage when the secondary battery is stable; therefore, if the open-circuit voltage in a stable condition (hereinafter referred to as a stable open-circuit voltage) is calculated, the state of charge of the secondary battery may be estimated.

However, if charge/discharge is frequently repeated as a secondary battery mounted on a vehicle, the open-circuit voltage is seldom stable after a charge is finished. When charge/discharge is performed, polarization is generated in the secondary battery and gradually disappears after completion of charge/discharge. It usually takes extremely long period of time from more than ten hours to several days before the polarization disappears and the secondary battery is stabilized. Therefore, charge/discharge is started again in many cases before the secondary battery is sufficiently stabilized, and it is extremely difficult to measure the stable open-circuit voltage of the secondary battery.

Figure 3:
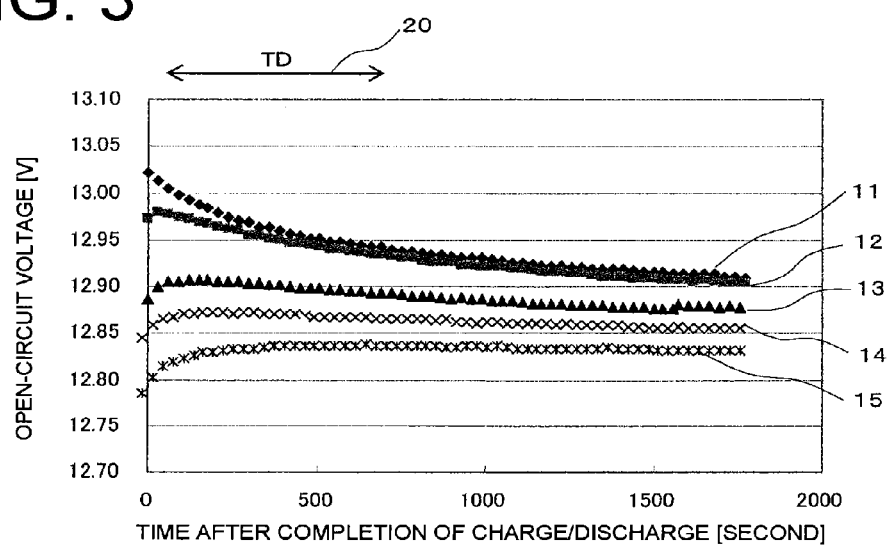
FIG. 3 is a graph showing an example of the open-circuit voltage of the secondary battery after charge/discharge finishes.

An example of change over time of the open-circuit voltage of the secondary battery 110 after charge/discharge finishes is shown in FIG. 3. In the figure, the horizontal axis indicates the elapsed time t after completion of charge/discharge, and the vertical axis indicates the open-circuit voltage of the secondary battery 110. In the figure, although the open-circuit voltage indicated by the numeral 11 is lowered in monotone after completion of charge/discharge, the stable open-circuit voltage is not reached even after 30 minutes. Therefore, charge/discharge must be stopped for longer period of time to wait for the open-circuit voltage to be stabilized to measure the stable open-circuit voltage.

In addition, the open-circuit voltages indicated by the numerals 12 to 15 tends to temporarily increase after completion of charge/discharge, gradually decrease after reaching the peak value, and the stable open-circuit voltage is not reached even after 30 minutes. Changes of the open-circuit voltages after charge/discharge stops vary as shown in FIG. 3 based on the states of charge/discharge in the past. Especially, there is a tendency for the open-circuit voltage to temporarily increase immediately after completion of charge/discharge when there is a large discharge from the secondary battery before completion of charge/discharge as shown by the numerals 12 to 15 that indicate change of the open-circuit voltage shown in FIG. 3. In this case, the peak point of the open-circuit voltage changes based on the state of charge/discharge.

Therefore, with the state-of-charge estimation method of this embodiment, in the control part 130, a voltage characteristic formula is used that may approximate change over time of the open-circuit voltage of the secondary battery 110 after completion of charge/discharge with high precision. This voltage characteristic formula is optimally approximated using the voltage measurement value obtained during the given data acquisition period after completion of charge/discharge so that the stable open-circuit voltage may be estimated with high precision without waiting for the secondary battery 110 to be stabilized. An example of the data acquisition period is shown by the numeral 20 in FIG. 3. A data acquisition period TD is sufficiently short compared with the time taken to stabilize the open-circuit voltage after completion of charge/discharge, and may be approximately 30 minutes, for example. Hereinafter, the voltage measurement value obtained from the voltage sensor 120 during the data acquisition period TD shall be denoted with $VM_j$ (j=1 to m and the m is a natural number).

In order to be able to estimate the stable open-circuit voltage with high precision when the secondary battery 110 is stabilized using the voltage measurement value $VM_j$ of the constant period of time (data acquisition period TD) after completion of charge/discharge, the following approximate expression including a quartic or more exponential attenuation function should be used as a voltage characteristic formula. When it is sufficient to be able to estimate with a given precision, a quadratic or cubic exponential attenuation function may be used as a voltage characteristic formula.

$$V(t) = A_1 \times \exp(B_1 \times t) + A_2 \times \exp(B_2 \times t) + \ldots + A_n \times \exp(B_n \times t) + Vc \quad (1)$$

Where, the n is an integer not less than 4 showing the order of the exponential attenuation function of the formula (1), the t is the elapsed time after completion of charge/discharge, and $\{A_i\}$ (i=1 to n), $\{B_i\}$ (i=1 to n), and Vc are the adjustment parameters (fitting parameter).

In a vehicle, such as a car, discharge basically does not completely stop even in the idle state, and very small amount of current, i.e., the dark current, continues to flow. Therefore, the open-circuit voltage in a strict sense can not be measured, and the voltage with the dark current flowing is considered to be an open-circuit voltage.

Since the open-circuit voltage after completion of charge/discharge shows various changes as shown in FIG. 3, the voltage characteristic formula (1) having a quartic or more exponential attenuation function need to be able to approximate change of the open-circuit voltage of the secondary battery 110 with high precision. For this purpose, the measured value of the open-circuit voltage of the secondary battery 110 obtained during the given data acquisition period after completion of charge/discharge is used to optimally adjust the adjustment parameter of the formula (1).

However, change of the open-circuit voltage after completion of charge/discharge changes depending on charge/discharge state in the past, and the open-circuit voltage may especially show a monotonous change or a change with a peak. Therefore, fitting calculation of the adjustment parameter may diverge, or it may take long time before convergence. To fit the voltage characteristic formula of the formula (1) quickly and precisely using the voltage measurement value with different tendency of change, the initial value of the adjustment parameter used for the formula (1) must be appropriately selected and used.

With the state-of-charge estimation method of this embodiment, in order to adequately determine the initial value of the adjustment parameter, a voltage measurement value with suitable measurement timing (hereinafter referred to as a selected voltage measurement value) is selected from the voltage measurement values $\{VM_j\}$ (j=1 to m), and the initial value of the adjustment parameter is calculated with it. As a selected voltage measurement value, in addition to the voltage measurement value $VM_1$ obtained at the beginning of the data acquisition period TD and the voltage measurement value $VM_m$ obtained at the end of the data acquisition period TD, the voltage measurement values $\{VM_k\}$ (k=$b_i$; i=1 to (n−1)) specified with the given integer string $\{b_i\}$ (i=1 to (n−1)) are used.

The integer string $\{b_i\}$ (i=1 to (n−1)) is a row of the integer set in advance, and includes integers that satisfy the following formula and that increase in monotone.

$$1 < b_1 < b_2 < \ldots < b_{n-1} < m \quad (2)$$

Here, each of the initial values $A0_1$ to $A0_n$ of the adjustment parameters $A_1$ to $A_n$ is calculated with the following formula:

$$A0_1 = VM_1 - VM_k (k=b_1)$$

$$A0_2 = VM_{kk} - VM_k (kk=b_1, k=b_2) \quad (3)$$

$$A0_n = VM_k - VM_m (k=b_{n-1})$$

Each of the initial values $B0_1$ to $B0_n$ of the adjustment parameters $B_1$ to $B_n$ is calculated with the following formula.

$$B0_1 = -1/((b_1-1) \times \Delta t \times C)$$

$$B0_2 = -1/((b_2-1) \times \Delta t \times C) \quad (4)$$

$$B0_{n-1} = -1/((b_{n-1}-1) \times \Delta t \times C)$$

$$B0_n = -1/((m-1) \times \Delta t \times C)$$

Here, the C is a real number set in advance.

Moreover, the initial value $V0c$ of the adjustment parameter Vc is calculated with the following formula.

$$V0c = VM_m \quad (5)$$

Hereinafter, for the sake of simplicity, the voltage characteristic formula of the open-circuit voltage after completion of charge/discharge shall be the approximate expression including the quartic exponential attenuation function as shown below.

$$V(t) = A_1 \times \exp(B_1 \times t) + A_2 \times \exp(B_2 \times t) + A_3 \times \exp(B_3 \times t) + A_4 \times \exp(B_4 \times t) + Vc \quad (6)$$

Here, the initial values of the adjustment parameters $A_1$ to $A_4$, $B_1$ to $B_4$, and Vc are given with the following formula:

$$A0_1 = VM_1 - VMb_1$$

$$A0_2 = VMb_1 - VMb_2$$

$$A0_3 = VMb_2 - VMb_3$$

$$A0_4 = VMb_3 - VM_m \quad (7)$$

$$B0_1 = -1/((b_1-1) \times \Delta t \times C)$$

$$B0_2 = -1/((b_2-1) \times \Delta t \times C)$$

$$B0_3 = -1/((b_3-1) \times \Delta t \times C)$$

$$B0_4 = -1/((m-1) \times \Delta t \times C)$$

$$V0_c = VM_m$$

In this embodiment, the integer string $\{b_i\}$ (i=1 to (n−1)) is set to satisfy the following formula.

$$(b_1-1) < (b_2-b_1) < \ldots < (b_{n-1}-b_{n-2}) < (m-b_{n-1}) \quad (8)$$

The formula shown above indicates that the gap between the selection timing of the selected voltage measurement value is short at the beginning of the data acquisition period TD, and becomes gradually longer.

Figure 4:
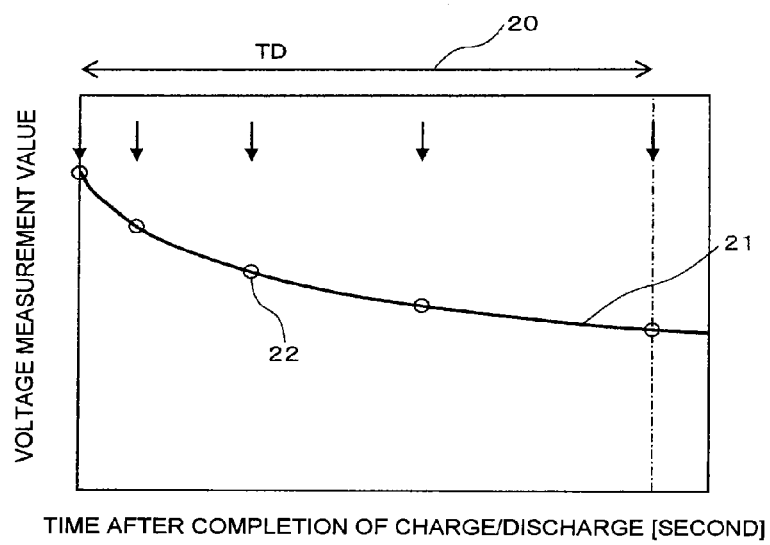
FIG. 4 is a schematic diagram showing change of the open-circuit voltage of the secondary battery for illustrating how to determine the initial value of an adjustment parameter.

Hereinafter, the selection timing of the selected voltage measurement value is described with reference to FIG. 4. FIG. 4 is a schematic diagram showing change of the open-circuit voltage of the secondary battery 110 for illustrating the selection timing of the selected voltage measurement value. Here, the data acquisition period TD shown by the numeral 20 is magnified. In addition, the numeral 21 denotes the open-circuit voltage, and the circles with the numeral 22 denote the selected voltage measurement values used for calculating the initial value of the adjustment parameter. The gap between the selection timing of the selected voltage measurement value 22 becomes gradually longer from the beginning to the end of the data acquisition period TD.

The selection timing of the selected voltage measurement value 22 is preferably set to correspond to the amount of change (rate of change) of the open-circuit voltage 21. That is to say, as shown in FIG. 4, the open-circuit voltage 21 shows a large change at the beginning of the data acquisition period TD, and shows a smaller change as it approaches the end. Therefore, the selection timing of the selected voltage measurement value 22 is provided with small gaps at the beginning of the data acquisition period TD with a large change of the open-circuit voltage 21, and the gaps of the selection timing of the selected voltage measurement value 22 should preferably be longer as the change of the open-circuit voltage 21 becomes smaller. The formula (8) indicates that the gaps of the selection timing of the selected voltage measurement value 22 are set as described above.

When the order n is set to 4, the integer string $b_i$ (i=1 to 3) satisfies the following formula.

$$(b_1-1) < (b_2-b_1) < (b_3-b_2) < (m-b_3) \quad (9)$$

As described above, when the voltage characteristic formula is quartic (n=4), the integer string $b_i$ (i=1 to 3) is set in advance to select 3 (=n−1) voltage measurement values $\{VM_k\}$ (k=$b_i$; i=1 to 3) between the first voltage measurement value $VM_1$ and the last voltage measurement value $VM_m$ of the data acquisition period TD. Thereby, the five selected voltage measurement values (4 voltage sections) including the first voltage measurement value $VM_1$, the voltage measurement values $\{VM_k\}$ (k=$b_i$; i=1 to 3), and the last voltage measurement value $VM_m$ are used for calculation of the initial value of the adjustment parameter $A_1$ to $A_4$, $B_1$ to $B_4$, and Vc.

When the state of charge does not need to be estimated with high precision, the order of the voltage characteristic formula may be quadratic or cubic as described above. In such a case, the number of the integer strings $b_i$ (i=1 to (n−1)) may be reduced to one or two (two or three voltage sections, respectively).

Using the voltage measurement value $VM_1$, $\{VM_k\}$ (k=$b_i$; i=1 to (n−1)), and Vm selected at the selection timing that satisfies the formula (8) (formula (9) when the order n is 4), the initial value of the adjustment parameters $\{A0_i\}$ (i=1 to n), $\{B0_i\}$ (i=1 to n), and V0c are calculated from the formulas (3)

to (5) (formula (7) when the order n is 4). Then, the adjustment parameter is gradually corrected from the above-described initial value to minimize the error between the open-circuit voltage V (t) of the formula (1) (formula (6) when the order n is 4) and the voltage measurement value $\{VM_j\}$ (j=1 to m) to calculate the convergence value of the adjustment parameter.

The convergence value of the adjustment parameter calculated as described above is used for the voltage characteristic formula (1) (formula (6) when the order n is 4) to calculate the stable open-circuit voltage of the secondary battery 110 therewith. The stable open-circuit voltage is given with the value Vc when the elapsed time t is infinite in the formula (1). Alternatively, the stable open-circuit voltage may be calculated by substituting the given time defined in advance required for the battery voltage to be stable into the t of the formula (1). Once the stable open-circuit voltage is calculated, the state of charge corresponding to the calculated stable open-circuit voltage may be estimated from the relation between the stable open-circuit voltage and the state of charge prepared in advance.

Next, with regard to the state-of-charge estimation method of the secondary battery 110 performed in the control part 130 of this embodiment, the process flow is described using the flow chart shown in FIG. 1. Data processing shown in FIG. 1 is a process mainly performed by the control part 130 based on the control program held in the storage part 140, and starts immediately after completion of charge/discharge of the secondary battery 110 in the secondary-battery power system 100, or at given timing after completion.

When the estimation process of the state of charge is required after completion of charge/discharge in the control part 130, at first at step S11, the parameters required for data processing are set. The parameters required for data processing include a sampling period $\Delta t$ for obtaining the voltage measurement value from the voltage sensor 120, the number of samples to obtain m, the integer string $\{b_i\}$ (i=1 to (n−1)) used for calculating the initial value of the adjustment parameter of the voltage characteristic formula (1), and a real number C used for calculating the initial value of the adjustment parameter $\{B_i\}$ (i=1 to n).

At step S12, the voltage measurement values $\{VM_j\}$ (j=1 to m) are obtained from the voltage sensor 120 with the above-described sampling period $\Delta t$ until the number of samples to obtain m is reached. The obtained voltage measurement values $\{VM_j\}$ (j=1 to m) are successively stored in the storage part 140.

At step S13, the selected voltage measurement value $VM_1$, $\{VM_k\}$ (k=$b_i$; i=1 to (n−1)), and $VM_m$ used for calculating the initial value of the adjustment parameter $\{Ai\}$ (i=1 to n) are selected from the voltage measurement value $\{VM_j\}$ (j=1 to m).

At step S14, the selected voltage measurement values $VM_1$, $\{VM_k\}$ (k=$b_i$; i=1 to (n−1)), and $VM_m$ are used to calculate the initial value $\{A0_i\}$ (i=1 to n) of the adjustment parameter $\{Ai\}$ (i=1 to n) from the formula (3). In addition, at step S15, the integer string $\{b_i\}$ (i=1 to (n−1)) and the real number C are used to calculate the initial value $\{B0_i\}$ (i=1 to n) of the adjustment parameter $\{B_i\}$ (i=1 to n) with the formula (4). Moreover, at step S16, the initial value V0c of the adjustment parameter Vc is calculated from the formula (5).

The initial values $\{A0_i\}$ (i=1 to n), $\{B0_i\}$ (i=1 to n), and V0c of the adjustment parameters determined at steps S14 to S16 are used to optimize, at the following step S17, the adjustment parameters $\{Ai\}$ (i=1 to n), $\{B_i\}$ (i=1 to n), and Vc. In this example, although the explanation is made assuming the optimization with the least-square method is used; however, Kalman filter calculation etc. may be used with no problem.

At step S17, to minimize the error variance of the voltage characteristic formula $\{V(t_j)\}$ (j=1 to m) of the formula (1) and the voltage measurement value $\{VM_j\}$ (j=1 to m) obtained from the voltage sensor 120 at step S12, the adjustment parameter $\{Ai\}$ (i=1 to n), $\{B_i\}$ (i=1 to n), and Vc are successively updated from the initial values calculated at steps S14 to S16. The above-described error variance is given with the following formula. Where, the tj is the elapsed time after completion of charge/discharge corresponding to $VM_j$.

$$S=\Sigma[V(t_j)-VM_j]^2 \qquad \text{(formula 10)}$$

At step S18, the convergence values $\{Ai\}$ (i=1 to n), $\{B_i\}$ (i=1 to n), and Vc of the adjustment parameters calculated with the least-square method at step S17 are saved in the storage part 140 to be able to use for calculation of the voltage characteristic formula (1).

At the last step S19, the optimized adjustment parameter Vc is used to estimate the state of charge of the secondary battery 110. When the stable open-circuit voltage is calculated using the voltage characteristic formula (1), the exponential attenuation term is converged to 0 as the t becomes larger in the formula (1); therefore, the stable open-circuit voltage is equal to the constant term Vc of the formula (1). Thus, when the formula (1) is used as a voltage characteristic formula of the secondary battery 110, the open-circuit voltage in a stable condition may be immediately obtained from the constant term Vc of the formula (1). As an option, the stable open-circuit voltage may be calculated by substituting the given time defined in advance required for the battery voltage to be stable into the voltage characteristic formula (1) using the optimized adjustment parameter.

As described above, in this embodiment, the selection timing of the selected voltage measurement value is provided with small gaps at the beginning of the data acquisition period with large change of the open-circuit voltage, and the gaps of the selection timing of the selected voltage measurement value becomes longer as change of the open-circuit voltage becomes smaller. Thereby, the convergence value of the adjustment parameter may be determined quickly and stably.

Figure 5:
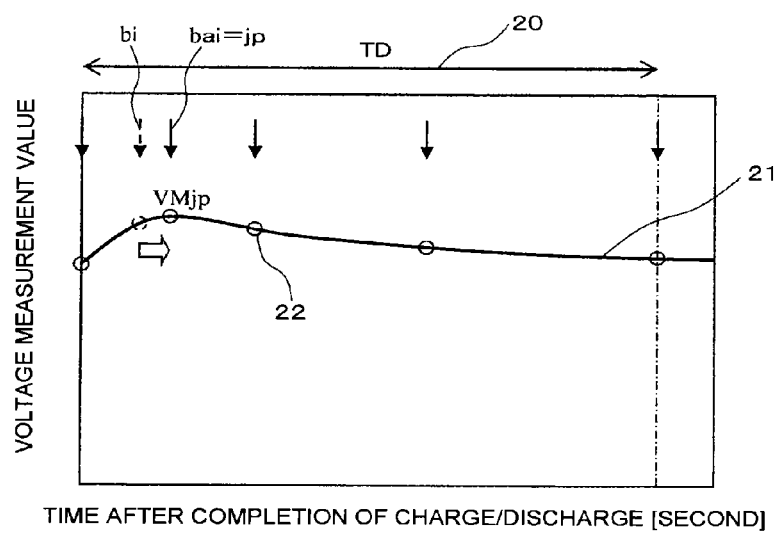
FIG. 5 is a diagram for illustrating a calculating method of an initial value of an adjustment parameter with a state-of-charge estimation method according to a second embodiment of the present invention.

The state-of-charge estimation method according to the second embodiment of the present invention is described with reference to FIG. 5. FIG. 5 is a diagram for illustrating how to calculate the initial value of the adjustment parameter of the voltage characteristic formula (1) in the state-of-charge estimation method according to this embodiment, and schematically shows change of the open-circuit voltage of a secondary battery 110. In the first embodiment, the integer string $\{b_i\}$ (i=1 to (n−1)) for determining the selection timing of the selected voltage measurement value is fixed to be the value set in advance; however, in this embodiment, $\{b_i\}$ (i=1 to (n−1)) is adjusted according to change of the voltage measurement value $\{VM_j\}$ (j=1 to m).

In this embodiment, when the voltage measurement value $\{VM_j\}$ (j=1 to m) is obtained, whether $\{VM_j\}$ (j=1 to m) is changing in monotone or $\{VM_j\}$ (j=1 to m) shows change with the greatest or smallest peak on the way is judged. When the voltage measurement value $\{VM_j\}$ (j=1 to m) is changing in monotone, in the same manner as the first embodiment, the integer string $\{b_i\}$ (i=1 to (n−1)) set in advance is used to calculate the initial values of the adjustment parameters $\{Ai\}$ (i=1 to n) and $\{B_i\}$ (i=1 to n). As opposed to this, when $\{VM_j\}$ (j=1 to m) shows change with the peak, the integer string $\{b_i\}$ (i=1 to (n−1)) is adjusted as follows.

The j of the voltage measurement value $VM_j$ when $\{VM_j\}$ (j=1 to m) is at the peak is determined to use as jp. Next, the $b_i$ nearest to the jp is determined from the integer string $\{b_i\}$ (i=1 to (n−1)) and is replaced by the jp. The integer string adjusted in this way is $\{ba_i\}$ (i=1 to (n−1)). Note that $b_i=ba_i$ is used as-is except for the $b_i$ nearest to the jp. Using this integer string $\{ba_i\}$ (i=1 to (n−1)), the selected voltage measurement value $\{VM_k\}$ (k=$ba_i$; i=1 to (n−1)) is selected from the voltage measurement value $\{VM_j\}$ (j=1 to m).

Next, in the formula (3), the selected voltage measurement value $\{VM_k\}$ (k=$ba_i$; i=1 to (n−1)) is used instead of the selected voltage measurement value $\{VM_k\}$ (k=$b_i$; i=1 to (n−1)) to calculate the initial value $\{A0_i\}$ (i=1 to n) of the adjustment parameter $\{Ai\}$ (i=1 to n). In addition, in the formula (4), the integer string $\{ba_i\}$ (i=1 to (n−1)) is used instead of the integer string $\{b_i\}$ (i=1 to (n−1)) to calculate the initial value $\{B0_i\}$ (i=1 to n) of the adjustment parameter $\{B_i\}$ (i=1 to n).

Figure 6:
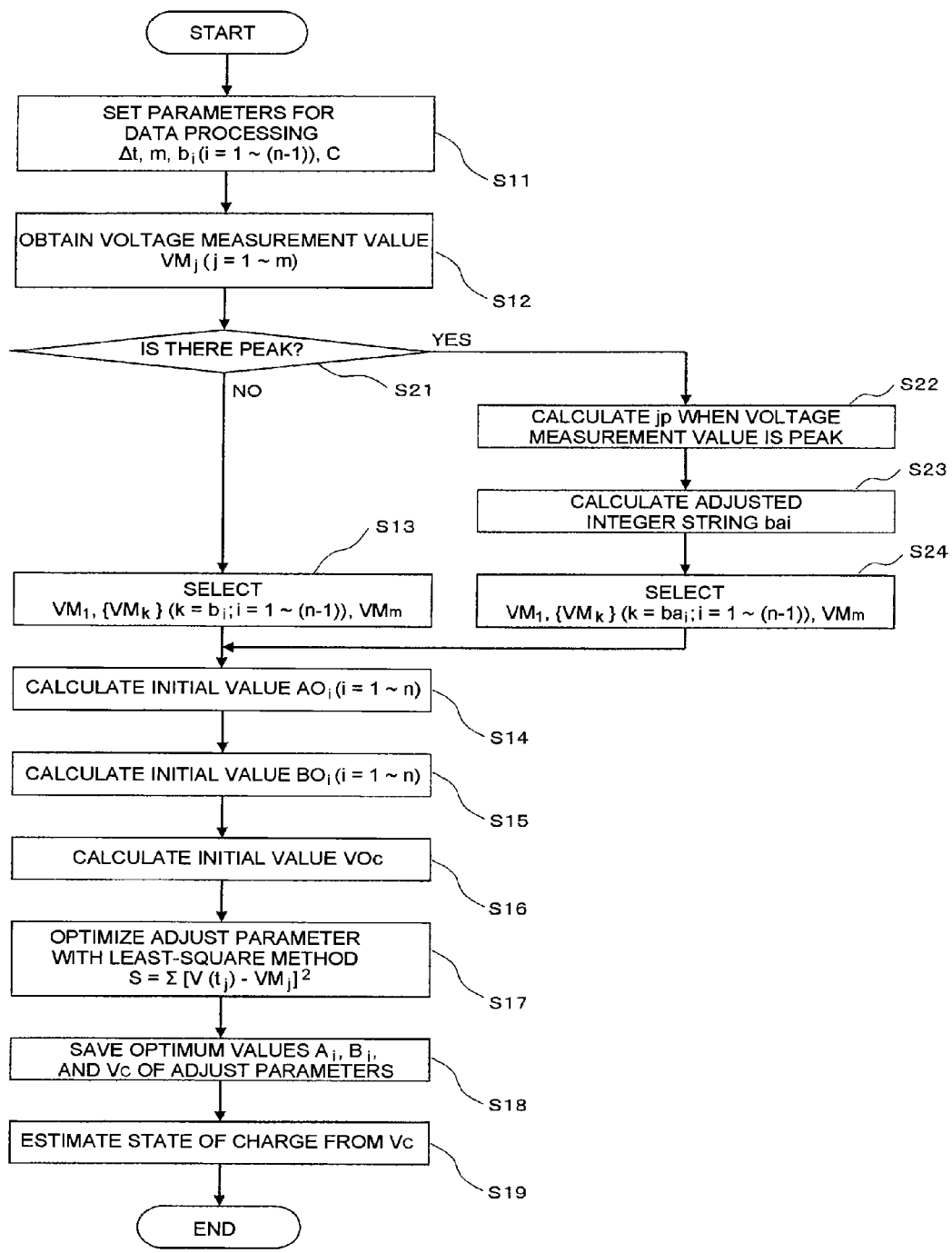
FIG. 6 is a flow chart for illustrating the state-of-charge estimation method according to the second embodiment of the present invention.

The formula (1) is optimized in the same manner as the first embodiment and the stable open-circuit voltage is calculated by using the optimized formula (1) below. Moreover, the state of charge of the secondary battery 110 is estimated from the calculated stable open-circuit voltage. The flow chart of the process of the state-of-charge estimation method according to this embodiment is shown in FIG. 6. Hereinafter, difference from FIG. 1 showing the flow of the processes of the state-of-charge estimation method according to the first embodiment is described.

Steps S21 to S24 are added in the flow of the processes of the state-of-charge estimation method according to this embodiment. First, whether the voltage measurement value $\{VM_j\}$ (j=1 to m) has the peak or not is judged at step S21, and when it has the peak, the process proceeds to step S22, while when it has no peak, the process proceeds to step S13. At step S22, the j of the voltage measurement value $VM_j$ when $\{VM_j\}$ (j=1 to m) is the peak is determined to use as the jp. Next, at step S23, the $b_i$ nearest to the jp is determined from the integer string $\{b_i\}$ (i=1 to (n−1)) and is replaced by the jp to use this as the integer string $\{ba_i\}$ (i=1 to (n−1)). Note that $b_i=ba_i$ is used as-is except for the $b_i$ nearest to the jp. At step S24, the selected voltage measurement value $\{VM_k\}$ (k=$ba_i$; i=1 to (n−1)) is selected. Thereafter, steps S14 to S19 are successively processed to estimate the state of charge of the secondary battery 110 in the same manner as the first embodiment.

In this embodiment, one of the integer strings $\{ba_i\}$ (i=1 to (n−1)) is adjusted to match the peak of the voltage measurement value $\{VM_j\}$ (j=1 to m). Thereby, each exponential attenuation item of the voltage characteristic formula (1) may be divided for optimization depending on when the voltage measurement value $VM_j$ is increasing or decreasing. As a result, the convergence value of the adjustment parameter may be quickly and stably determined.

Figure 7:
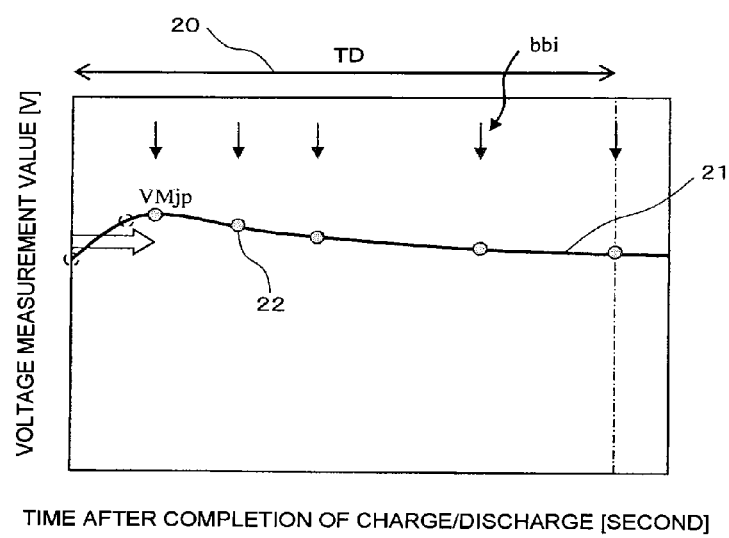
FIG. 7 is a diagram for illustrating a calculating method of an initial value of an adjustment parameter with a state-of-charge estimation method according to a third embodiment of the present invention.

The state-of-charge estimation method according to the third embodiment of the present invention is described with reference to FIG. 7. FIG. 7 is a diagram for illustrating how to calculate the initial value of the adjustment parameter of the voltage characteristic formula (1) in the state-of-charge estimation method according to this embodiment, and schematically shows change of the open-circuit voltage of a secondary battery 110. In this embodiment, in the same manner as the second embodiment, $\{b_i\}$ (i=1 to (n−1)) is adjusted according to change of the voltage measurement value $\{VM_j\}$ (j=1−m).

When $\{VM_j\}$ (j=1 to m) shows change with the peak, at first, in the same manner as the second embodiment, the j of the voltage measurement value $VM_j$ when $\{VM_j\}$ (j=1 to m) is at the peak is determined to use as the jp. Next, in this embodiment, the integer string $\{b_i+jp-1\}$ (i=1 to (n−1)) is calculated by moving the integer string $\{b_i\}$ (i=1 to (n−1)) by (jp−1) to use this as the integer string $\{bb_i\}$ (i=1 to (n−1)).

In this embodiment, the selected voltage measurement value $\{VM_k\}$ (k=$bb_i$; i=1 to (n−1)) is selected from the voltage measurement value $\{VM_j\}$ (j=1 to m) using the above-described integer string $\{bb_i\}$ (i=1 to (n−1)). Then, in the formula (3), instead of the selected voltage measurement values $VM_1$ and $VM_k$ (k=$b_i$; i=1 to (n−1)), the selected voltage measurement values $VM_{jp}$ and $VM_k$ (k=$bb_i$; i=1 to (n−1)) are used to calculate the initial value $\{A0_i\}$ (i=1 to n) of the adjustment parameter $\{Ai\}$ (i=1 to n). In addition, in the formula (4), the integer string $\{bb_i\}$ (i=1 to (n−1)) is used instead of the integer string $\{b_i\}$ (i=1 to (n−1)) to calculate the initial value $\{B0_i\}$ (i=1 to n) of the adjustment parameter $\{B_i\}$ (i=1 to n).

Figure 8:
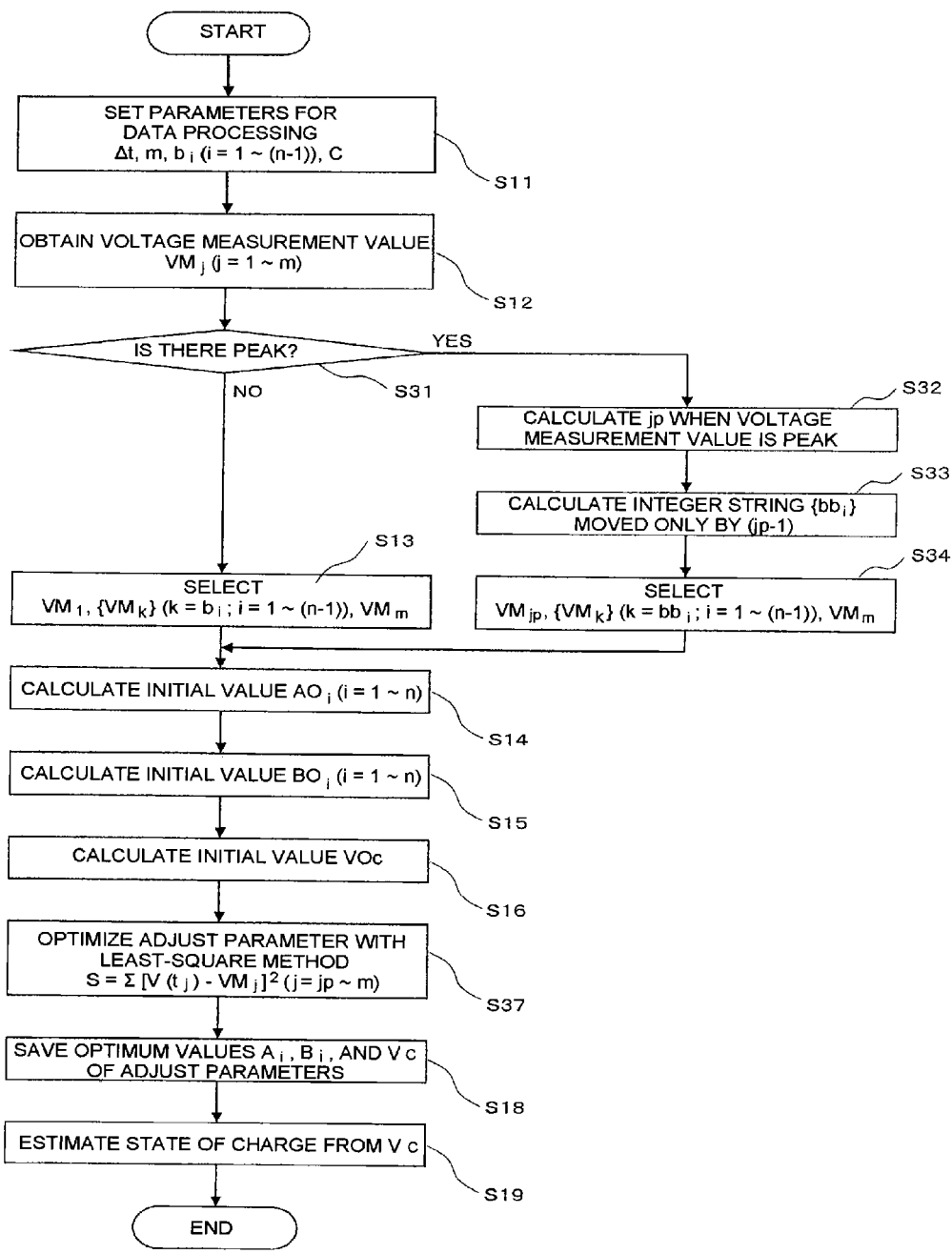
FIG. 8 is a flow chart for illustrating the state-of-charge estimation method according to the third embodiment of the present invention.
Figure 9:
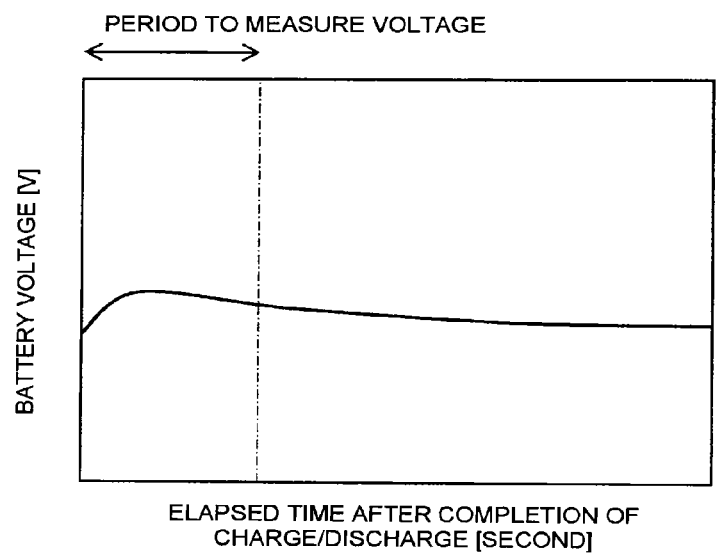
FIG. 9 is a graph showing an example in which the voltage measurement value reverses in the middle of a voltage measurement period.

Hereinafter, in the same manner as the first embodiment, the formula (1) is optimized and used to calculate the stable open-circuit voltage. Moreover, the state of charge of the secondary battery 110 is estimated from the calculated stable open-circuit voltage. The flow of the process of the state-of-charge estimation method according to this embodiment is shown in FIG. 8. Hereinafter, difference from FIG. 1 showing the flow of the process of the state-of-charge estimation method according to the first embodiment is described.

Steps S31 to S34 are added in the flow of the processes of the state-of-charge estimation method according to this embodiment. First, whether the voltage measurement value $\{VM_j\}$ (j=1 to m) has the peak or not is judged at step S31, and when it has the peak, the process proceeds to step S32, while when it has no peak, the process proceeds to step S13. At step S32, the j of the voltage measurement value $VM_j$ when $\{VM_j\}$ (j=1 to m) is at the peak is determined to use as jp. Next, at step S33, the integer string $\{bb_i\}$ (i=1 to (n−1)) is calculated by moving the integer string $\{b_i\}$ (i=1 to (n−1)) by (jp−1).

At step S34, $V_{jp}$ is selected as the first selected voltage measurement value from the voltage measurement value $\{VM_j\}$ (j=1 to m), and the selected voltage measurement values $VM_k$ (k=$bb_i$; i=1 to (n−1)) and $VM_m$ are selected.

At step S37, to minimize the error variance of the voltage characteristic formula V(t) of the formula (1) from the voltage measurement value $\{VM_j\}$ (j=jp to m) obtained from the voltage sensor 120 at step S12, the adjustment parameters $\{Ai\}$ (i=1 to n), $\{B_i\}$ (i=1 to n), and Vc are successively updated from the initial values calculated at steps S14 to S16. The above-described error variance is given with the following formula.

$$S = \Sigma[V(t_j) - VM_j]^2 (j = jp \text{ to } m)$$

Hereinafter, in the same manner as the first embodiment, steps S18 to S19 are successively processed to estimate the state of charge of the secondary battery 110.

In this embodiment, the selected voltage measurement value used for calculating the initial value of the adjustment parameter is selected from the voltage measurement value decreasing in monotone after the peak of the voltage measurement value $\{VM_j\}$ (j=1 to m). Thereby, each exponential attenuation item of the voltage characteristic formula (1) may be optimized by using only the voltage measurement value decreasing in monotone. As a result, the convergence value of the adjustment parameter may be quickly, easily and stably determined.

Another embodiment is described below, in which the selected voltage measurement value used for calculating the initial value of the adjustment parameter is selected from the voltage measurement value decreasing in monotone after the peak value $VM_{jp}$ of the voltage measurement value $\{VM_j\}$ (j=1 to m). In the above-described third embodiment, in order to select the voltage measurement value used for calculating the initial value of the adjustment parameter from the voltage measurement value decreasing in monotone after the peak point, the integer string $\{bb_i\}$ (i=1 to (n−1)) is calculated by moving the integer string $\{b_i\}$ (i=1 to (n−1)) by (jp−1). In this case, when the gap between $b_{n-1}$ and m is small (the difference is small), $bb_n-1$ may exceed the m.

Therefore, in this embodiment, the integer string $\{bc_i\}$ is calculated that almost maintains the ratio of the gap of the integer string $\{b_i\}$ (i=1 to (n−1)) distributed between the integer 1 and the m, which is $(b_1-1):(b_2-b_1): \ldots :(m-b_{n-1})$, and that is distributed between the integer jp and the m. The integer string $\{bc_i\}$ is expressed in the following formula.

$$\{bc_i\} = \{\text{integer part of } [(b_i-1) \times (m-jp)/(m-1)+jp]\} (i=1 \text{ to } (n-1))$$

The above-described integer string $\{bc_i\}$ is distributed between the integer jp and the m, and never exceeds them; therefore, (n−1) voltage measurement values ((n+1) when including the jp and them) required for calculating the initial value may be selected.

With the above-described integer string $\{bc_i\}$, the initial value $\{A0_i\}$ (i=1 to n), $\{B0_i\}$ (i=1 to n), and $V0c$ are calculated with:

$$A0_1 = VM_{jp} - VM_k (k=bc_1)$$

$$A0_i = VM_{kk} - VM_k (kk=bc_{i-1}, k=bc_i; i=2 \text{ to } (n-1))$$

$$A0_n = VM_k - VM_m (k=bc_{n-1})$$

$$B0_i = -1/((bc_i-1) \times \Delta t \times C) \ (i=1 \text{ to } (n-1))$$

$$B0_n = -1/((m-1) \times \Delta t \times C)$$

$$V0c = VM_m$$

In the above-mentioned embodiments, the voltage characteristic formula (formula 1) including four terms of exponential attenuation function is described as an example; however, not limited to four terms, and more terms of the exponential attenuation function may be included. In addition, the number to obtain the voltage measurement values, etc. and sampling period etc. after completion of charge/discharge of the secondary battery may be suitably changed depending on the characteristics, the degree of degradation, etc. of the secondary battery. Moreover, the integer string $\{b_i\}$ (i=1 to (n−1)) that is a constant set in advance and the real number C may be selected or calculated depending on the type, temperature, degree of degradation, etc. of the secondary battery.

As described above, according to the present invention, the initial value of the adjustment parameter of the voltage characteristic formula that may approximate change over time of the open-circuit voltage of the secondary battery with high precision may be appropriately set. Thereby, there are provided a state-of-charge estimation method, a state-of-charge estimation device, and a secondary-battery power system that may quickly and stably determine the convergence value of the adjustment parameter and estimate the state of charge. Calculation may be successively converged quickly (fewer repetition) for various voltage profiles. Thereby, computation is possible even with built-in software with limited computing capability, for example.

The description in the embodiments only shows examples of the state-of-charge estimation method, the state-of-charge estimation device, and the secondary-battery power system according to the present invention, and is not limited thereto. Detailed structure, detailed operation, etc. of the state-of-charge estimation method, the state-of-charge estimation device, and the secondary-battery power system according to the embodiments may be suitably changed without departing from the spirit of the present invention.

Reference Numerals

10: Load
100: Secondary-battery power system
101: State-of-charge estimation device
110: Secondary battery
120: Voltage sensor
130: Control part
140: Storage part
150: Charging circuit

The invention claimed is:

1. A state-of-charge estimation method, wherein change over time of an open-circuit voltage (OCV) of a secondary battery after completion of charge/discharge is approximated with a voltage characteristic formula having an adjustment parameter, and the open-circuit voltage in a stable condition of the secondary battery is calculated from the voltage characteristic formula to estimate the state of charge of the secondary battery, the method comprising:
    obtaining m (m is a natural number) voltage measurement values of the open-circuit voltage of the secondary battery in a given cycle during a given data acquisition period after completion of charge/discharge of the secondary battery;
    selecting the voltage measurement value at given selection timing from the m voltage measurement values to use as a selected voltage measurement value;
    calculating the initial value of the adjustment parameter based on the selected voltage measurement value and the selection timing;
    calculating a convergence value of the adjustment parameter by gradually correcting the adjustment parameter from the initial value so that the error between the open-circuit voltage calculated with the voltage characteristic formula and the m voltage measurement values is the smallest;
    calculating the open-circuit voltage in the stable condition by using the convergence value of the adjustment parameter for the voltage characteristic formula; and
    estimating the state of charge of the secondary battery from the open-circuit voltage in the stable condition.

2. The state-of-charge estimation method according to claim 1, wherein
    when the adjustment parameters are $\{A_i\}$ (i=1 to n), $\{B_i\}$ (i=1 to n), and Vc, the n is an integer equal to or greater than four, and the t is an elapsed time after completion of charge/discharge, the voltage characteristic formula is given as:

$$V(t) = A_1 \times \exp(B_1 \times t) + A_2 \times \exp(B_2 \times t) + \ldots + A_n \times \exp(B_n \times t) + Vc$$

when $\{b_i\}$ (i=1 to (n−1)) is an integer string that satisfies $1 < b_1 < b_2 < \ldots < b_{n-1}$ and that is set in advance to correspond to the selection timing,
    the initial values $\{A0_i\}$ (i=1 to n), $\{B0_i\}$ (i=1 to n), and V0c of the adjustment parameters $\{A_i\}$ (i=1 to n), $\{B_i\}$ (i=1 to n), and Vc, respectively, are calculated using the selected voltage measurement value at the selection timing determined from the integer string $\{b_i\}$ (i=1 to (n−1)).

3. The state-of-charge estimation method according to claim 2, wherein
    the integer string $\{b_i\}$ (i=1 to (n−1)) satisfies $(b_1-1) < (b_2-b_1) < \ldots < (b_{n-1}-b_{n-2}) < (m-b_{n-1})$.

4. The state-of-charge estimation method according to claim 2 or 3, wherein
when the voltage measurement value is $\{VM_j\}$ (j=1 to m), the cycle to obtain the voltage measurement value is $\Delta t$, and the C is a real number set in advance,
the voltage measurement value VM1 obtained at the beginning of the data acquisition period, a voltage measurement value $\{VM_k\}$ (k=$b_i$; i=1 to (n-1)) with the integer string $\{b_i\}$(i=1 to (n-1)) as the selection timing, and the selected voltage measurement value $VM_m$ obtained at the end of the data acquisition period are selected as the selected voltage measurement values, and
the initial values $\{A0_i\}$ (i=1 to n), $\{B0_i\}$ (i=1 to n), and V0c are calculated with:

$A0_1 = VM_1 - VM_k(k=b_1)$ $A0_i = VM_{kk} - VM_k(kk=b_{i-1}, k=b_i;\ i=2$ to $(n-1))$ $A0_n = VM_k - VM_m(k=b_{n-1})$ $B0_i = -1/((b_i-1)\times\Delta t\times C)(i=1$ to $(n-1))$ $B0_n = -1/((m-1)\times\Delta t\times C)$ $V0c = VM_m.$ 5. The state-of-charge estimation method according to claim 4, wherein
when the voltage measurement value $\{VM_j\}$ (j=1 to m) has a peak value $VM_{jp}$ that becomes the greatest or the smallest during the data acquisition period, the selection timing $b_i$ nearest to the timing jp of the peak value is determined from the integer string $\{b_i\}$ (i=1 to (n-1)), and the selection timing $b_i$ is replaced by the timing jp of the peak value to form the integer string $\{ba_i\}$ (i=1 to (n-1)), the initial value $\{A0_i\}$ (i=1 to n) and $\{B0_i\}$ (i=1 to n) are calculated using the integer string $\{ba_i\}$ (i=1 to (n-1)).

6. The state-of-charge estimation method according to claim 2 or 3, wherein
when the voltage measurement value is $\{VM_j\}$ (j=1 to m), the cycle to obtain the voltage measurement value is $\Delta t$, the C is a real number set in advance, and the voltage measurement value $\{VM_j\}$ (j=1 to m) has a peak value $VM_{jp}$ that becomes the greatest or the smallest in the data acquisition period,
as selected voltage measurement values, the voltage measurement value $VM_{jp}$ of the peak value, the voltage measurement value $\{VM_k\}$ (k=$bb_i$; i=1 to (n-1)) that uses as the selection timing the integer string $\{bb_i\}=\{b_i+jp-1\}$ (i=1 to -(n-1)) with the integer string $\{b_i\}$ (i=1 to (n-1)) changed only by (jp-1), and the selected voltage measurement value $VM_m$ obtained at the end of the data acquisition period are selected, and
the initial value $\{A0_i\}$ (i=1 to n), $\{B0_i\}$ (i=1 to n), and V0c are calculated with:

$A0_1 = VM_{jp} - VM_k(k=bb_1)$ $A0_i = VM_{kk} - VM_k(kk=bb_{i-1}, k=bb_i;\ i=2$ to $(n-1))$ $A0_n = VM_k - VM_m(k=bb_{n-1})$ $B0_i = -1/((bb_i-1)\times\Delta t\times C)\ (i=1$ to $(n-1))$ $B0_n = -1/((m-1)\times\Delta t\times C)$ $V0c = VM_m.$ 7. The state-of-charge estimation method according to claim 2 or 3, wherein
when the voltage measurement value is $\{VM_j\}$ (j=1 to m), the cycle to obtain the voltage measurement value is $\Delta t$, the C is a real number set in advance, and the voltage measurement value $\{VM_j\}$ (j=1 to m) has a peak value $VM_{jp}$ that becomes the greatest or the smallest in the data acquisition period,
as selected voltage measurement values, the voltage measurement value $VM_{jp}$ of the peak value, the voltage measurement value $\{VM_k\}$ (k=$bc_i$; i=1 to (n-1)) that uses, as the selection timing, the integer string $\{bc_i\}=\{$integer part of $[(b_i-1)\times(m-jp)/(m-1)+jp]\}$ (i =1 to (n-1)) that moved the integer string $\{b_i\}$ (i=1 to (n-1)) between the jp and the m to keep the interval ratio of the integer string as much as possible, and the selected voltage measurement value $VM_m$ obtained at the end of the data acquisition period are selected,
the initial values $\{A0_i\}$ (i=1 to n), $\{B0_i\}$ (i=1 to n), and V0c are calculated with:

$A0_1 = VM_{jp} - VM_k(k=bc_1)$ $A0_i = VM_{kk} - VM_k(kk=bc_{i-1}, k=bc_i;\ i=2$ to $(n-1))$ $A0_n = VM_k - VM_m(k=bc_{n-1})$ $B0_i = -1/((bc_i-1)\times\Delta t\times C)\ (i=1$ to $(n-1))$ $B0_n = -1/((m-1)\times\Delta t\times C)$ $V0c = VM_m.$ 8. The state-of-charge estimation method according to claim 2, wherein
the open-circuit voltage when the secondary battery is in a stable condition is calculated by substituting a given time defined in advance to the voltage characteristic formula using the convergence value for the adjustment parameter.

9. A state-of-charge estimation device for estimating a state of charge of a secondary battery, comprising:
a voltage sensor for measuring a voltage of the secondary battery; a control part for performing and controlling calculation for estimating the state of charge using a voltage characteristic formula having an adjustment parameter; and a storage part for storing a voltage measurement value measured with the voltage sensor and data used for the calculation with the control part, wherein
the control part obtains m (m is a natural number) voltage measurement values of the open-circuit voltage of the secondary battery in a given cycle during a given data acquisition period after completion of charge/discharge of the secondary battery, selects a voltage measurement value at given selection timing from the m voltage measurement values to use as a selected voltage measurement value, calculates the initial value of the adjustment parameter based on the selected voltage measurement value and the selection timing, calculates the convergence value of the adjustment parameter by gradually correcting the adjustment parameter from the initial value so that the error between the open-circuit voltage calculated with the voltage characteristic formula and the m voltage measurement values is the smallest, calculates the open-circuit voltage in the stable condition by using the convergence value of the adjustment parameter for the voltage characteristic formula, and estimates the state of charge of the secondary battery from the open-circuit voltage in the stable condition.

10. The state-of-charge estimation device according to claim 9, wherein when the adjustment parameters are $\{Ai\}$ (i=1 to n), $\{B_i\}$ (i=1 to n), and Vc, the n is an integer equal to or greater than four, and the t is an elapsed time after completion of charge/discharge, the control part uses the following formula as the voltage characteristic formula $$V(t)=A_1 \times \exp(B_1 \times t)) + A_2 \times \exp(B_2 \times t) + \ldots + A_n \times \exp(B_n \times t) + Vc$$

and when $\{b_i\}$ (i=1 to (n−1)) is an integer string that satisfies $<b_1<b_2< \ldots <b_{n-1}$ and that is set in advance to correspond to the selection timing, the initial values $\{A0_i\}$ (i=1 to n), $\{B0_i\}$ (i=1 to n), and $V0c$ of the adjustment parameters $\{Ai\}$ (i=1 to n), (i=1 to n), and Vc, respectively, are calculated using the selected voltage measurement value at the selection timing determined from the integer string $\{b_i\}$ (i=1 to (n−1)).

11. A secondary-battery power system, comprising:

a secondary battery;

a charging circuit for charging the secondary battery; and the state-of-charge estimation device according to claim 9 or 10 for estimating the state of charge of the secondary battery.

\* \* \* \* \*